US009123410B2

(12) United States Patent
Castro et al.

(10) Patent No.: US 9,123,410 B2
(45) Date of Patent: Sep. 1, 2015

(54) MEMORY CONTROLLER FOR REDUCING CAPACITIVE COUPLING IN A CROSS-POINT MEMORY

(71) Applicant: Intel Corporation, Santa Clara, CA (US)

(72) Inventors: Hernan A. Castro, Shingle Springs, CA (US); Jeremy M. Hirst, Orangevale, CA (US); Eric Carman, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/011,476

(22) Filed: Aug. 27, 2013

(65) Prior Publication Data

US 2015/0063021 A1    Mar. 5, 2015

(51) Int. Cl.
  *G11C 11/00*    (2006.01)
  *G11C 13/00*    (2006.01)
  *G11C 8/12*    (2006.01)

(52) U.S. Cl.
  CPC .............. *G11C 13/0004* (2013.01); *G11C 8/12* (2013.01); *G11C 13/003* (2013.01); *G11C 13/0028* (2013.01); *G11C 13/0033* (2013.01); *G11C 2213/77* (2013.01)

(58) Field of Classification Search
  CPC ........................ G11C 13/0004; G11C 13/0069
  USPC .................................................. 365/163, 148
  See application file for complete search history.

(56) References Cited

U.S. PATENT DOCUMENTS

| 8,374,022 | B2 | 2/2013 | Langtry et al. |
| 2004/0233709 | A1 | 11/2004 | Tsuchida et al. |
| 2007/0109835 | A1 | 5/2007 | Hsu |
| 2010/0008125 | A1* | 1/2010 | Inaba ............................ 365/148 |
| 2010/0259960 | A1* | 10/2010 | Samachisa ..................... 365/51 |
| 2011/0199814 | A1 | 8/2011 | Meade |
| 2012/0075915 | A1 | 3/2012 | Maejima |
| 2013/0003437 | A1 | 1/2013 | Siau |

OTHER PUBLICATIONS

Kau et al., "A stackable cross point phase change memory", 2009 International Electron Devices Meeting Technical Digest, Dec. 2009.
International Search Report and Written Opinion received for PCT Patent Application No. PCT/US2014/052706, mailed on Dec. 3, 2014, 12 pages.

* cited by examiner

*Primary Examiner* — Huan Hoang
(74) *Attorney, Agent, or Firm* — Grossman, Tucker, Perreault & Pfleger, PLLC

(57) ABSTRACT

The present disclosure relates to a memory controller. The memory controller may include a memory controller module configured to identify a target word line in response to a memory access request, the target word line included in a cross-point memory, the memory controller module further configured to perform a memory access operation on a memory cell of the cross-point memory, the memory cell coupled between the target word line and a bit line; and a word line control module configured to float at least one adjacent word line adjacent the target word line, the floating comprising decoupling the at least one adjacent word line from at least one of a first voltage source or a second voltage source. In some embodiments, the floating reduces an effective capacitance associated with the target word line during the memory access operation.

20 Claims, 7 Drawing Sheets

MEMORY CONTROLLER FOR REDUCING CAPACITIVE COUPLING IN A CROSS-POINT MEMORY

FIELD

The present disclosure relates to control techniques for a cross-point memory array.

BACKGROUND

Phase change memory is a memory device which typically uses a chalcogenide material for the memory elements. A memory element is the unit that actually stores information. In operation, the phase change memory stores information on the memory element by changing the phase of the memory element between amorphous and crystalline phases. The chalcogenide material may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell that also includes a selector, i.e., a select device coupled to the memory element. The select devices are configured to facilitate combining a plurality of memory elements into an array.

Phase change memory elements may be arranged in a cross-point memory array including row address lines and column address lines arranged in a grid. The row address lines and column address lines, called word lines (WLs) and bit lines (BLs), respectively, cross in the formation of the grid and each memory cell is coupled between a WL and a BL where the WL and BL cross (i.e., cross-point). It should be noted that row and column are terms of convenience used to provide a qualitative description of the arrangement of WLs and BLs in cross-point memory.

During a programming operation, the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a first time period sufficient to cause the memory element to "snap back" and then maintained for a second time period to transition the memory element from the amorphous state to the crystalline state or from the crystalline state to the amorphous state. Snap back is a property of the composite memory element that results in an abrupt change in conductivity and an associated abrupt change in the voltage across the memory element.

In a read operation, a target memory cell is selected via the application of a first bias voltage to the WL and a second bias voltage to the BL that cross at the target memory cell for a time interval. A resulting differential bias voltage across the memory element is configured to be greater than a maximum set voltage and less than a minimum reset voltage for the memory element. In response, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

Cross-point memory arrays are sensitive to parasitic capacitance including electrode capacitances and capacitive coupling between adjacent conductors (i.e., line to line capacitance), particularly during snap back. Coupling capacitance may exist between a target WL and adjacent WLs or a target BL and adjacent BLs. The abrupt change in voltage (and conductance of the memory element) during snap back can induce relatively high currents through the memory cell from the parasitic capacitances. These currents may result in disturbance or damage to the memory element and may thus shorten the operational life of the memory element and/or memory array.

Prior to a memory access operation, WLs and BLs are typically coupled to nominal bias voltages so that little or no energy is stored in a coupling capacitance. During a memory access operation, a target WL and/or target BL may be decoupled from the nominal bias voltage and coupled to a different, select bias voltage. As the voltage on the selected WL and/or BL transitions to the select bias voltage, a potential difference is produced between the selected WL and adjacent WLs and/or the selected BL and adjacent BLs. Coupling capacitances may begin to charge up (i.e., store energy) in response to this changing potential difference ($i = C\,dv/dt$).

When the target WL or BL reaches the select bias voltage, a non-zero voltage exists across the coupling capacitances (e.g., |Vselect bias−Vnominal bias|) and the coupling capacitance stores energy equal to $\tfrac{1}{2} CV^2$. The potential difference (voltage) across a target memory cell is then the difference between the WL select bias voltage and the BL select bias voltage.

If a snap back event occurs, the impedance of the memory element decreases abruptly and the voltage across the memory cell also decreases abruptly. Current may flow from the coupling capacitors in response to the change in voltage. Since the target WL is coupled to the select bias voltage source and the adjacent WLs are coupled to the nominal bias voltage source, during transients, current from the supply voltage sources will flow in both the target WLs and the adjacent WLs as the sources attempt to maintain their supply voltages at Vselect and Vnominal, respectively. The coupling capacitances may also contribute energy in the form of displacement currents and/or conduction currents. Thus, current through a memory cell includes contributions from energy stored in coupling capacitances, voltage sources and energy associated with electrode capacitance.

Additional capacitance may exist in a signal path between the memory element and the decoding circuitry and/or sensing circuitry. One technique to reduce the disturbance is to disconnect the decoding and sensing circuitry from the target memory element at the time of snap back and to reconnect it after the snap-back event. A drawback of this technique is that the signal generated by the snap back may be degraded after reconnection to the decoding and sensing circuits resulting in unreliable detection of the state of the memory element. Other techniques configured to mitigate the effects of the undesirable capacitive coupling often involve increased component count, reduced efficiency and/or increased circuit complexity.

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
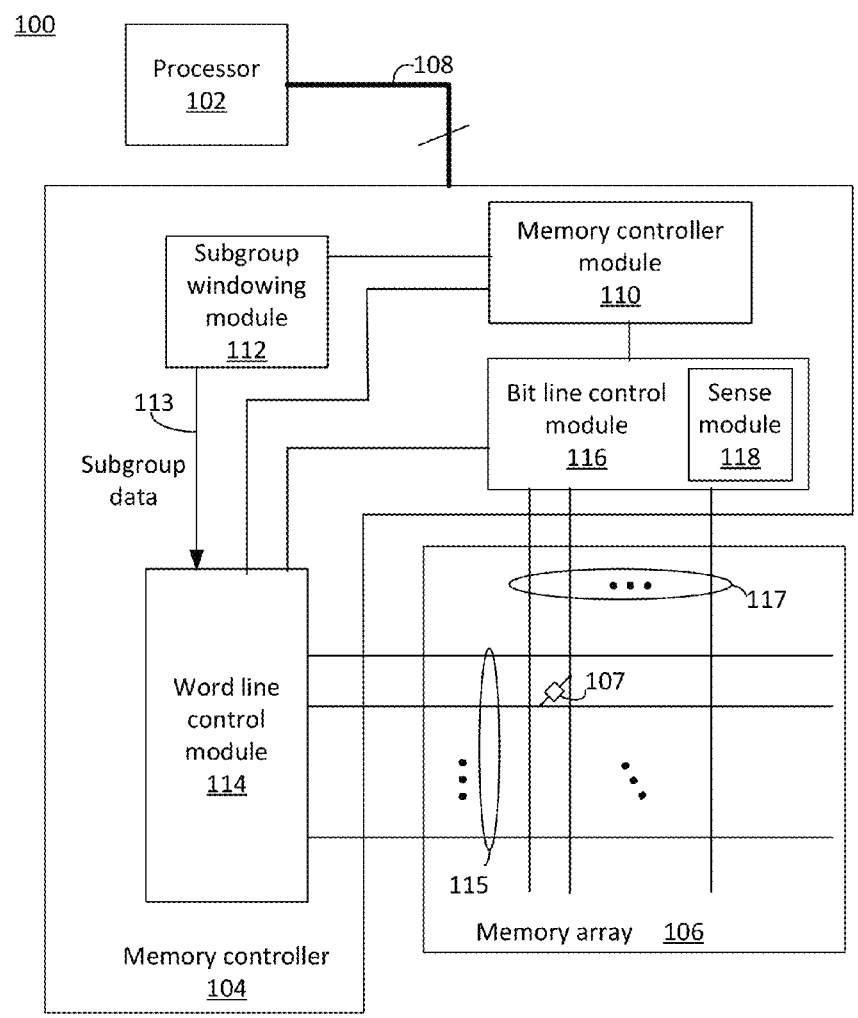
FIG. 1 illustrates a system block diagram consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

Generally, this disclosure describes a system and method configured to reduce effective capacitance associated with a target word line (or bit line) in a cross-point memory during memory access operations. Effective capacitance includes parasitic capacitance, coupling capacitance and/or electrode capacitance associated with the target word line (or bit line). The system and method are configured to decouple at least one address line adjacent each side of a target address line from selected bias voltage sources, i.e., to "float" the at least one address line prior to accessing a memory cell. The system and method are configured to define (or select) a subgroup of address lines (word lines or bit lines) that includes at least one adjacent address line. When an address line in the subgroup is identified for a memory access operation (e.g., a read or write operation), the system and method are configured to determine whether the identified address line is located too close to a boundary of the subgroup. As used herein, boundary is related to a maximum or minimum address for the subgroup. If the identified address line is too close to the boundary, a new subgroup may be defined that includes the identified address line and pluralities of adjacent address lines between the identified address line and the boundaries of the subgroup.

The system and method are further configured to decouple at least one of the address lines in the subgroup from a first voltage source ("deselect voltage source") and to decouple selected ones of the address line except the target address line from a second voltage source ("select voltage source"). Select voltage source and deselect voltage source correspond to bias voltage sources for the memory elements, as will be described in more detail below. The adjacent address lines in the subgroup may thus be floating, thereby reducing effective capacitance associated with the target address line by reducing the effects of capacitive coupling (i.e., line to line capacitance) between the target address line and the adjacent address lines. A duration of the decoupling is configured to include a time interval sufficient to allow a read or write of the target memory element. The system and method are configured to retain coupling a target memory element to a decode path and associated decode and/or sensing circuitry thereby facilitating reliable sensing of the state of the target memory element.

The inventors of the present application have appreciated that floating a minimum two adjacent address lines on each side of the target address line is sufficient for most applications to achieve a substantial reduction in effective capacitance, although floating one address line on each side of the target address line may result in sufficient reduction in effective capacitance for some applications. While effective capacitance may be further reduced by floating more than two adjacent address lines on each side of the target line, each additional address line floated produces a relatively lesser reduction in the effective capacitance, i.e., the reduction in effective capacitance asymptotes to zero relatively quickly.

The inventors of the present application have further appreciated that a nominal subgroup size of eight address lines, including the target address line, provides a relatively efficient subgroup size. A subgroup size of eight includes up to four target address lines without necessitating moving (i.e., redefining) the subgroup. Thus, processing efficiency may be provided by redefining the subgroup for a subset of memory accesses (e.g., four) rather than with every memory access. It is further appreciated that a subgroup size of eight, since eight is a power of two, is configured to provide further efficiency in a binary environment.

Thus, effective capacitance may be reduced and memory element read accuracy may be preserved in a phase change cross-point memory system utilizing a system and method consistent with the present disclosure.

In the following, techniques for reducing effective capacitance are described with respect to word lines and memory read operations. Similar techniques may be utilized to reduce capacitive coupling in a cross-point memory for bit lines and/or write operations, consistent with the present disclosure.

FIG. 1 illustrates a system block diagram 100 consistent with several embodiments of the present disclosure. The system 100 includes a processor 102, a memory controller 104 and a memory array 106. The processor 102 is coupled to the memory controller 104 by bus 108. Processor 102 may provide read and/or write requests including memory address(es), and/or associated data to memory controller 104 and may receive read data from memory controller 104. It should be noted that system 100 is simplified for ease of illustration and description.

Memory array 106 corresponds to at least a portion of a phase change cross-point memory and includes a plurality of word lines 115, a plurality of bit lines 117 and a plurality of memory cells, e.g., memory cell 107. Each memory cell is coupled between a word line ("WL") and a bit line ("BL") at a cross point of the WL and the BL. Each memory cell includes a memory element configured to store information and may include a memory cell select device coupled to the memory element. Select devices may include ovonic threshold switches, diodes, bipolar junction transistors, field-effect transistors, etc. Memory array 106 is configured to store binary data and may be written to or read from, as described herein.

Memory controller 104 includes memory controller module 110, subgroup windowing module 112, WL control module 114 and BL control module 116. Memory controller module 110 is configured to perform operations associated with memory controller 104. For example, memory controller module 110 may manage communications with processor 102. Memory controller module 110 may be configured to identify one or more target WLs associated with each received memory address. For example, a WL identifier may correspond to a WL address. Memory controller module 110 may be configured to manage operations of WL control module 114 and BL control module 116 based, at least in part, on the target WL identifiers.

Subgroup windowing module 112 is configured to perform windowing operations, as described herein. In some embodiments, subgroup windowing module 112 may be configured to capture each memory address provided to memory controller 104 by processor 102 and to determine the one or more target WL identifier(s) associated with each memory address. In some embodiments, subgroup windowing module 112 may be configured to retrieve the target WL identifier(s) from the memory controller module 110.

Subgroup windowing module 112 is configured to determine a subgroup of WLs for decoupling from their bias voltage supplies. The subgroup of WLs may be determined based on the target WL identifier. For example, the subgroup may be identified by WL addresses and may be specified by a maximum WL address and a minimum WL address. In another example, the subgroup of WL addresses may be specified by a subgroup size and a maximum WL address or a minimum WL address. Subgroup size corresponds to a difference between the maximum WL address and the minimum WL address for the range of WL addresses. In some embodiments, the subgroups and/or subgroup size may be predetermined based, at least in part, on memory array 106 size, a number of WLs associated with the memory array 106, and/or an amount of effective capacitance reduction desired. For example, a local neighborhood of WLs that includes a plurality of subgroups may be predetermined or may be defined in response to a memory access request (e.g., based on the target WL identifier). Alternating subgroups in the local neighborhood may be deselected or floated, as described herein. The local neighborhood, subgroups and/or subgroup size may be configured to reduce circuit complexity and/or energy consumption while reducing effective capacitance, as described herein. The amount of effective capacitance reduction depends, at least in part, on a number of adjacent WLs on each side of the target WL that may be decoupled from their respective voltage supplies. For example, two adjacent WLs on each side of a target WL may provide sufficient reduction in effective capacitance for some applications.

In some embodiments, the subgroups may be determined based, at least in part, on existing subgroups and a new target WL identifier. If the new target WL identifier is closer than a margin (e.g., two WLs) to a boundary of the existing subgroup, the subgroup windowing module 112 may be configured to define a new subgroup that includes the new target WL and a sufficient margin between the new target WL and the boundary. For example, the subgroup windowing module 112 may be configured to shift the subgroup by a number of WLs that corresponds to a predefined fraction, e.g., one-half, of the subgroup size to define the new subgroup. If the new target WL identifier is not closer than the margin, the subgroup windowing module 112 may be configured to maintain the existing subgroup. Thus, the subgroup windowing module may be configured to shift the subgroup in discrete increments when the target WL is closer than the margin to the boundary so that a new subgroup is defined before a plurality of memory access operations rather than before every memory access operation. In this manner, efficiency may be preserved, i.e., circuit complexity and/or energy consumption may be reduced. The subgroup windowing module 112 may be configured to provide subgroup data 113 to the WL control module 114. Subgroup data 113 may include, but is not limited to, subgroup size, minimum WL address and/or maximum WL address. In some embodiments, the subgroup windowing module 112 may be configured to provide subgroup data 113 to the WL control module 114 with each WL address. In some embodiments, the subgroup windowing module 112 may be configured to provide subgroup data 113 to the WL control module when a next target WL address corresponds to a WL address closer than a minimum number of WL addresses from a subgroup boundary (i.e., a maximum WL address or a minimum WL address of a currently defined subgroup). In this manner, efficiency may be facilitated by adjusting the subgroup only when the next target WL will be too close to the current subgroup boundary. WL control module 114 is configured to receive target WL address(es) from memory controller module 110 and/or subgroup windowing module 112. WL control module 114 is further configured to receive subgroup data 113 from subgroup windowing module 112. WL control module 114 is configured to associate a plurality of switches configured to couple or decouple the subgroup of WLs to or from one or more bias voltage supplies, as described herein. WL control module 114 may be coupled to a plurality of WLs 115 included in memory array 106. Each WL may be coupled to a number of memory cells corresponding to a number of BLs 117.

BL control module 116 is configured to select one or more BLs for reading and/or writing operations. BL control module 116 may be configured to select a target BL by coupling a BL select bias voltage to the target BL and may be configured to deselect a BL by coupling a deselect bias voltage to the BL.

BL control module 116 may include a sense module 118 configured to detect a memory element state, e.g., a snap back event, during a sense interval in order to read contents of the memory cell. The detected memory element state may be communicated to memory controller module 110 for provision to processor 102.

Thus, memory controller 104 may be configured to receive a read and/or write request from processor 102 that includes a memory address, the read or write request and/or data. The memory controller module may be configured to identify a target WL based, at least in part, on the received memory address. The subgroup windowing module 112 may be configured to determine (e.g., select) a subgroup of WL addresses based, at least in part, on the target WL identifier (e.g., target WL address) and to provide subgroup data to the WL control module 114. The WL control module 114 is configured to float the plurality of WLs included in the subgroup to facilitate reliable memory access operations by reducing effective capacitance associated with the target WL, as described herein. Advantageously, the memory access operations may be performed without decoupling the sensing and/or decoding circuitry from the target memory cell.

Figure 2:
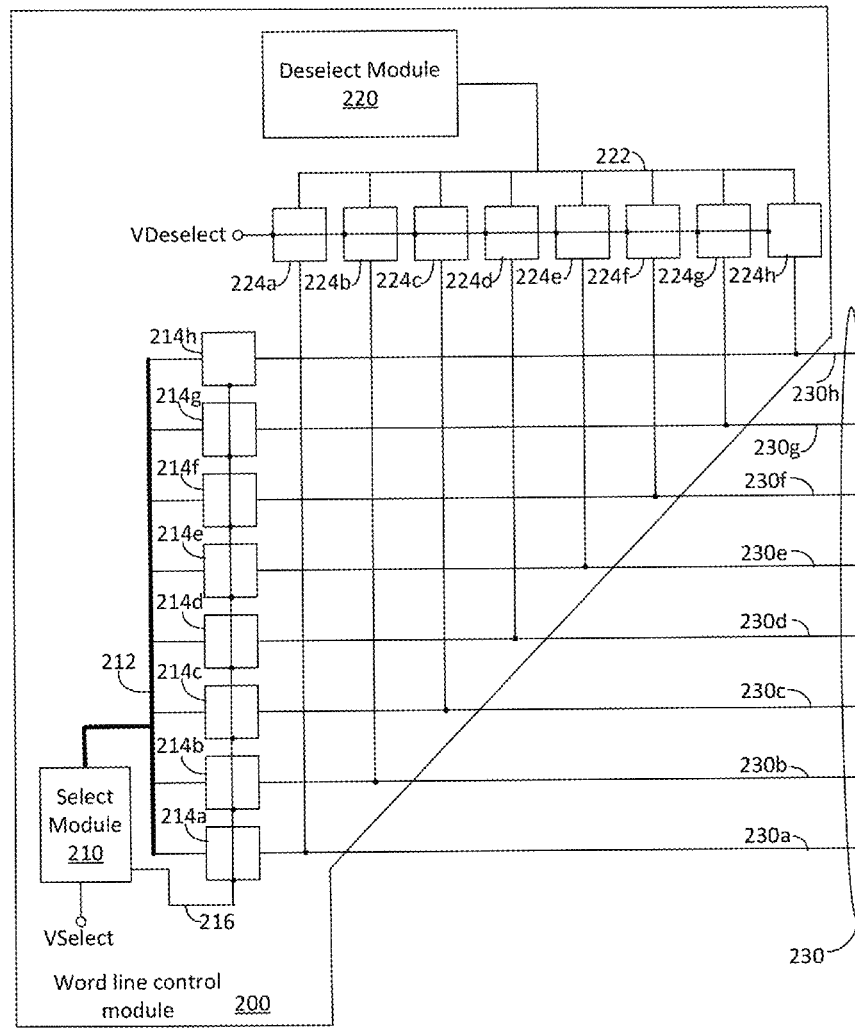
FIG. 2 illustrates a word line control module block diagram consistent with an exemplary embodiment of the present disclosure.

FIG. 2 illustrates a WL control module 200 block diagram consistent with an exemplary embodiment of the present disclosure. WL control module 200 is one example of the WL control module 114 illustrated in FIG. 1. WL control module 200 includes a select module 210, a deselect module 220, a plurality of select switches 214a, ..., 214h, a plurality of deselect switches 224a, ..., 224h, a select bus 212, a deselect line 222 and is coupled to a plurality of WLs, individually 230a, ..., 230h, collectively 230. For example, select switches 214a, ..., 214h and deselect switches 224a, ..., 224h may include one or more transistors. It should be noted that although WL control module 200 includes eight deselect switches 224a, ..., 224h, eight select switches 214a, ..., 214h and eight WLs 230a, ..., 230h, more or fewer of any of these may be included in WL controller module 200 consistent with the present disclosure. WL control module 200 further includes or is coupled to a select bias voltage Vselect and a deselect bias voltage Vdeselect. The select bias voltage Vselect may be coupled to select switches 214a, . . . , 214h via select module 210 and the deselect bias voltage Vdeselect is coupled to deselect switches 224a, . . . , 224h.

Select module 210 is configured to individually control the select switches 214a, . . . , 214h via bus 212 to controllably couple or decouple the select voltage Vselect to or from a respective WL 230a, . . . or 230h. For example, select module 210 may be configured to couple the select voltage to a target WL, e.g., WL 230f, in response to a read request, as described herein. In some embodiments, select module 210 may be configured to decouple the Vselect voltage source from the plurality of select switches 214a, . . . , 214h. Deselect module 220 is configured to control the deselect switches 224a, . . . , 224h via deselect line 222 to controllably couple the WLs 230a, . . . , 230h to the deselect voltage Vdeselect or to controllably decouple the WLs 230a, . . . , 230h from the deselect voltage as a group.

Select module 210 and deselect module 220 may together float one or more WLs by decoupling the WLs from both Vselect and Vdeselect. For example, a plurality of WLs adjacent each side of a selected (i.e., target) WL (e.g., WL 230f) may be floated to reduce effective capacitance that may degrade memory cell read results, as described herein. In this example, it should be noted that decoupling the group of WLs 230a, . . . , 230h from the deselect voltage Vdeselect decouples the target WL 230f from Vdeselect. Target WL 230f may not then be floating since target WL 230f may be coupled to the select voltage Vselect in preparation for a memory access operation, as described herein.

WL control module 200 is configured to controllably couple or decouple one or more WLs to or from the select voltage Vselect and to controllably couple or decouple the subgroup of WLs to or from the deselect voltage Vdeselect. Target WL(s) may be selected based, at least in part, on WL address identifier(s) received from memory controller module 110. The WL address data may include a subgroup size, a subgroup maximum WL address and/or a subgroup minimum WL address. The WL address data may be determined based, at least in part, on the target WL address identifier(s), as described herein.

Thus, WL controller module 200 is configured to controllably couple one or more target WL(s) to a select voltage Vselect, to controllably couple the subgroup of WLs including the target WL and a plurality of WLs adjacent each side of the target WL to a deselect voltage Vdeselect or to float the plurality of adjacent WLs. Effective capacitance between the target WL and the adjacent WLs may be thus reduced. One or more BLs may then be coupled to a BL select voltage and associated memory cell(s) may be reliably read without (or with lesser) effect from the parasitic capacitances including capacitive coupling.

Figure 3:
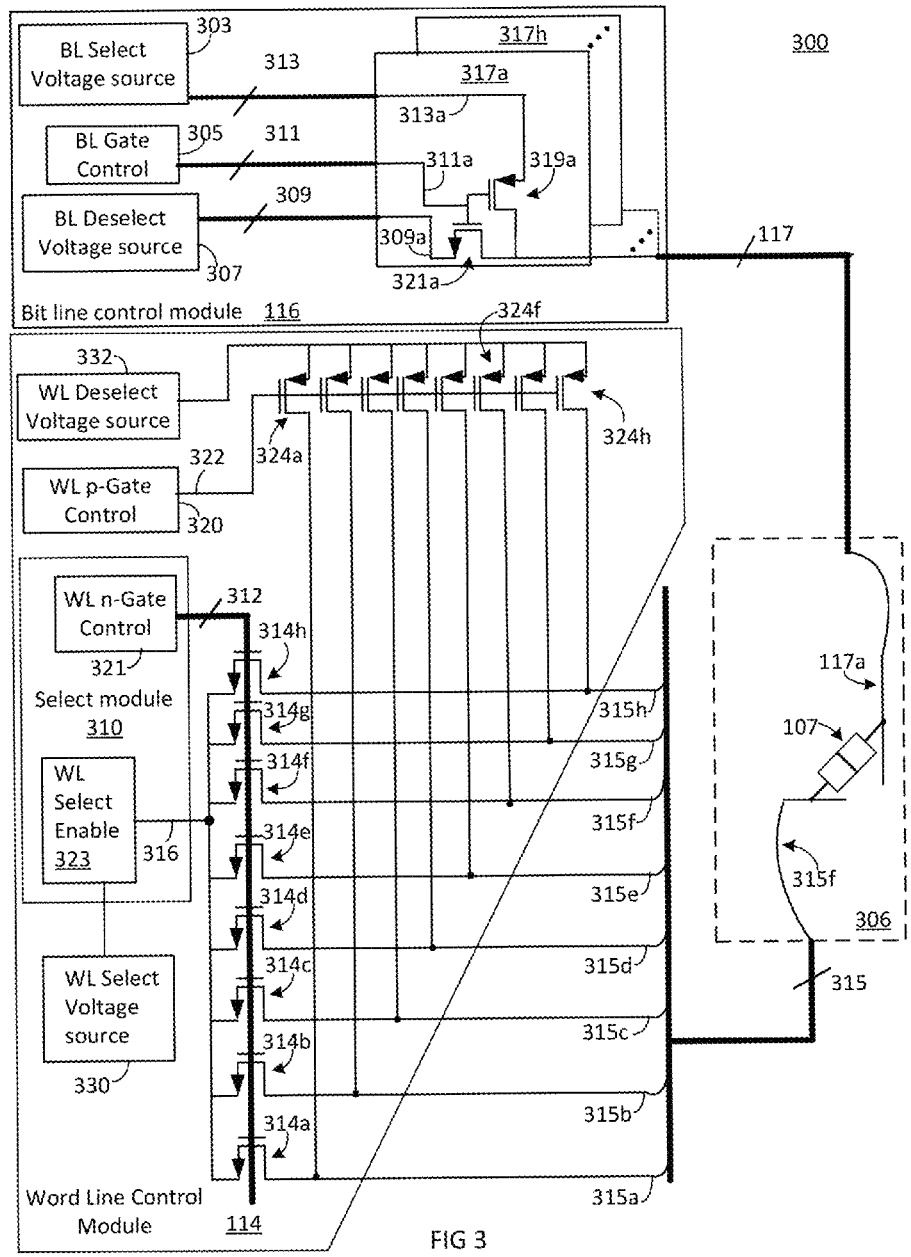
FIG. 3 illustrates one example of a bit line control module, a word line control module and a memory element consistent with an embodiment of the present disclosure.

FIG. 3 illustrates one example 300 of a BL control module 116, WL control module 114 and a portion 306 of memory array 106 that includes memory element 107 consistent with an embodiment of the present disclosure. In this example 300, the pluralities of switches 214a, . . . , 214h and 224a, . . . , 224h of FIG. 2 include n-channel and/or p-channel enhancement mode MOSFETs. This is one example of switches that may be utilized and is not meant to be limiting.

BL control module 116 is coupled to memory array 306 by a plurality of BLs 117. For example, BL 117a may be coupled to memory element 107. BL control module 116 includes a BL select voltage source 303, a BL gate control module 305, a BL deselect voltage source 307 and a plurality of BL switch modules 317a, . . . , 317h. BL select voltage source 303, BL gate control 305 and BL deselect voltage source 307 are each coupled to BL switch modules 317a, . . . , 317h by a respective bus 313, 311 and 309. A width of each bus 313, 311 and 309 corresponds to a number of BL switch modules 317a, . . . , 317h. In this non-limiting example, the number of BL switch modules is eight.

As illustrated by BL switch module 317a, each BL switch module 317a, . . . , 317h includes a p-channel enhancement mode MOSFET 319a and an n-channel enhancement mode MOSFET 321a with their respective gates coupled together and coupled to the BL gate control module 305 via, e.g., gate input line 311a. BL gate control module 305 is configured to control gate input line 311a and thereby, e.g., transistors 319a and 321a, to couple BL select voltage source 303 or BL deselect voltage source 307 to BL 117a to select or deselect BL 117a when, e.g., memory cell 107 is selected or deselected. In this configuration, a HIGH gate input is configured to couple BL deselect voltage source 307 to BL 117a (i.e., BL 117a deselected) and a LOW gate input is configured to couple BL select voltage source 303 to BL 117a (i.e., BL 117a selected). For example, HIGH may correspond to a BL select supply voltage and LOW may correspond to a BL deselect supply voltage. In some embodiments, BL gate control module 305 may be configured to decouple a plurality of BLs from both BL select voltage source 303 and BL deselect voltage source 307 by not supplying a gate input sufficient to turn on either transistor. In these embodiments, the decoupled BLs may then be configured to float, as described herein.

WL control module 114 is coupled to the portion 306 of memory array 106 by a plurality of WLs, individually 315a, . . . , 315h, collectively 315. For example, WL 315f may be coupled to memory element 107. WL control module 114 includes a select module 310, a WL p-gate control module 320, a WL select voltage source 330, a WL deselect voltage source 332, a plurality of p-channel transistors 324a, . . . , 324h and a plurality of n-channel transistors 314a, . . . , 314h. The p-channel transistors 324a, . . . , 324h correspond to deselect switches 224a, . . . , 224h of FIG. 2 and the n-channel transistors 314a, . . . , 314h correspond to select switches 214a, . . . , 214h of FIG. 2. Each deselect switch 324a, . . . , 324h and each select switch 314a, . . . , 314h is coupled to a respective WL 315a, . . . , 315h (i.e., one p-channel transistor and one n-channel transistor are coupled to one WL).

WL p-gate control module 320 is coupled to the collective gates of the plurality of deselect switches 324a, . . . , 324h via line 322. Thus, a control signal output from WL p-gate module 320 may be received by the plurality of deselect switches 324a, . . . , 324h as a group. In this manner, the plurality of deselect switches 324a, . . . , 324h may couple the plurality of WLs 315a, . . . , 315h to WL deselect voltage source 332 or to decouple the plurality of WLs 315a, . . . , 315h from the WL deselect voltage source 332. Although described as a line, line 322 may include a plurality of individual lines configured to couple one or more deselect switches 324a, . . . , 324h to the WL deselect voltage source 332.

After a subgroup has been determined by, e.g., subgroup windowing module 112, WL p-gate control module 320 may be provided WL address data for WL addresses to be included in the subgroup. WL p-gate control module 320 may then be configured to provide p-gate control outputs to all members of the subgroup, until new WL address data is received from subgroup windowing module 112. After the new WL address data is received by WL p-gate control module 320, WL p-gate control module 320 may then be configured to provide p-gate control outputs to all members of the new group. Thus, line 322 is configured to indicate that the plurality of deselect switches 324a, . . . , 324h is configured to receive p-gate control outputs from WL p-gate control 320 as a group. Further, the particular WLs associated with the group may change over time based, at least in part, on target WLs associated with memory addresses included with memory access requests and determination of a current or a new subgroup by subgroup windowing module 112, as described herein.

Select module 310 includes WL n-gate control module 321 and may include WL select enable module 323. Bus 312 is configured to couple WL n-gate control module 321 to the gates of WL select switches (i.e., n-channel transistors) 314a, . . . , 314h. WL n-gate control module 321 is configured to controllably couple WL select voltage source 330 to a target WL, e.g., WL 315f, using an appropriate WL select switch, e.g., WL select switch 314f. In other words, WL n-gate control module 321 is configured to individually control select switches 314a, . . . , 314h in order to couple WL select voltage source 330 to an individual WL 315a, . . . , 315h. WL n-gate control module 321 may couple or decouple WL select voltage source 330 to or from one or more WLs 315a, . . . , 315h. For example, WL n-gate control module 321 may be configured to couple WL select voltage source 330 to WL 315f by providing a gate output signal to the gate of select switch 314f configured to turn on the select switch 314f. When select switch 314f is ON, the WL select voltage source 330 may be coupled to WL 315f. The WL n-gate control module 321 may then be configured to decouple the remaining WLs of the plurality of WLs 315 from the WL select voltage source, e.g., by turning off select switches 314a, . . . , 314e, 314g, 314h. If WL p-gate control module 320 is also configured to decouple the WL deselect voltage source 332 from the plurality of WLs 315, the balance of the subgroup of WLs (e.g., plurality 315 less WL 315f) may be understood to be floating.

WL select enable module 323 is configured to couple or decouple WL select voltage source 330 to or from the plurality of WL select switches 314a, . . . , 314h via select enable line 316. For example, WL select enable module 323 may include a switch, e.g., a transistor, configured to controllably couple WL select voltage source 330 to WL select enable line 316 (and thereby to WL select transistors 314a, . . . , 314h). In some embodiments, WL select enable module 323 may be configured to decouple WL select voltage source 330 from the plurality of WL select switches 314a, . . . , 314h to facilitate sensing a memory cell state by reducing, e.g., snap back energy.

Thus, BL control module 116 and WL control module 114 are configured to manage coupling or decoupling BLs and/or WLs to or from respective BL and WL select or deselect voltage supplies. BL control module 116 and WL control module 114 may be further configured to float one or more BLs and/or WLs adjacent to a target BL and/or target WL in order to reduce effective capacitance associated with a target BL or target WL, as described herein. In some embodiments, WL control module 114 may be further configured to decouple the WL select voltage source from target and adjacent WLs to reduce snap back energy (if snap back occurs).

Figure 4:
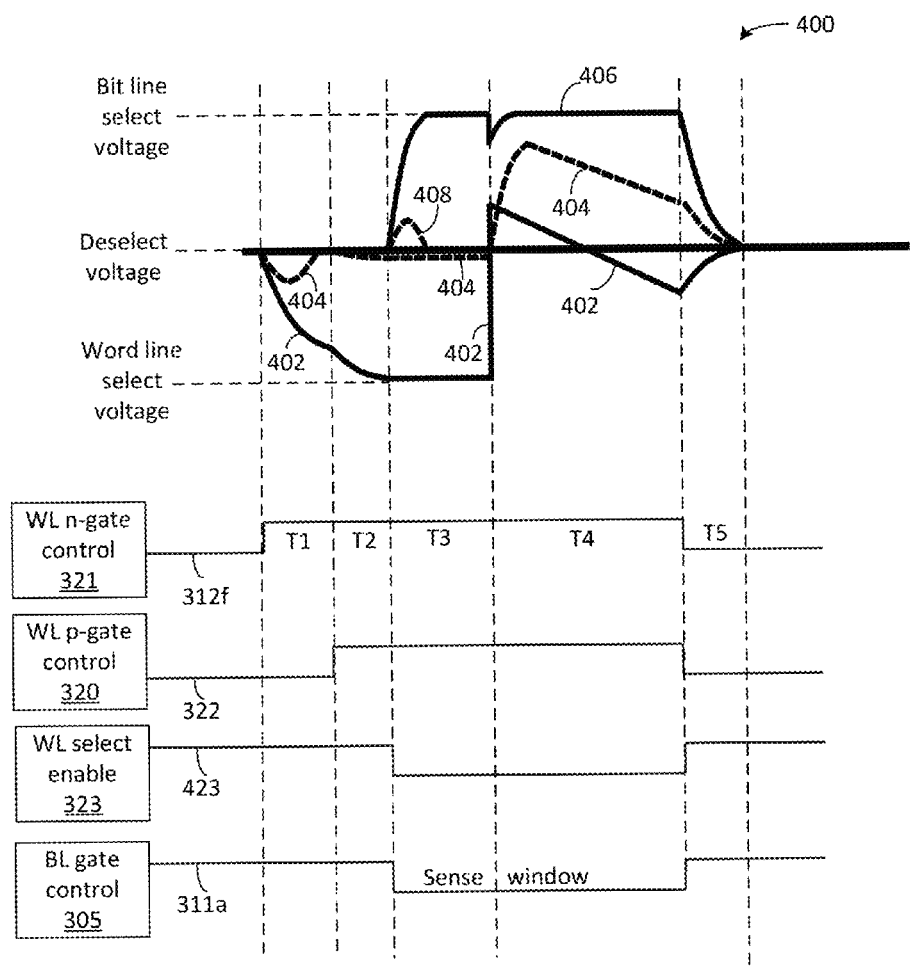
FIG. 4 illustrates word line and bit line voltage waveforms and timing diagrams for the example illustrated in FIG. 3.

FIG. 4 illustrates timing diagrams and a graph 400 of word and BL voltage waveforms for the example illustrated in FIG. 3. Thus, FIG. 4 may be better understood when read with respect to FIG. 3. Target WL voltage waveform is illustrated as solid line 402 corresponding to WL 315f of FIG. 3. Adjacent WL voltage waveform is illustrated as dotted line 404. Adjacent WL voltages correspond to voltages across one or more of WLs 315a, . . . , 315e, 315g, 315h. In this example, adjacent WL voltage waveform 404 corresponds to WL 315e or WL 315g. Target BL voltage waveform is illustrated as solid line 406 corresponding to BL 117a of FIG. 3. Adjacent BL voltage waveform is illustrated as dotted line 408. Deselect voltage corresponds to both the WL and BL deselect voltages, e.g., modules 307 and 332 of FIG. 3. In this example, BL select voltage is greater than the deselect voltage and WL select voltage is less than the deselect voltage. Thus, when both target BL 117a and target WL 315f are coupled to their respective select voltage sources by their respective gate control modules, a differential voltage equal to the difference between the BL select voltage and the WL select voltage may be applied across a target memory cell, e.g., memory cell 107. In some embodiments, the deselect voltage may be configured to have a value halfway between the BL select voltage and the WL select voltage, e.g., one half of the sum of the WL select voltage and the BL select voltage. For example, the differential voltage may correspond to a read voltage, i.e., may be greater than a memory cell maximum set threshold and less than a memory cell minimum reset threshold.

Timing diagram 312f corresponds to the WL n-gate control output from WL n-gate control module 321 to WL select switch 314f that is coupled to WL 315f. Timing diagram 322 corresponds to the WL p-gate control output from WL p-gate control module 320 to the group of WL deselect switches 324a, . . . , 324h that are coupled to respective WLs 315a, . . . , 315h. Timing diagram 311a corresponds to the BL gate control output from BL gate control module 305 to BL switch module 317a that is coupled to BL 117a. Timing diagram 423 corresponds to the WL select enable control input to WL select enable module 323, configured to couple or decouple the WL select voltage source 330 to or from WL select switches 314a, . . . , 314h.

FIG. 4 further illustrates five time intervals T1, T2, T3, T4 and T5 related to an example of a read operation of memory cell 107. Prior to timing interval T1, the WL select transistors 314a, . . . , 314f are OFF (i.e., not conducting), the WL deselect transistors 324a, . . . , 324h are ON and the BL gate control input to switch module 317a is LOW. Thus, in the timing interval prior to T1, the WLs 315a, . . . , 315h and the BLs 117 are decoupled from respective select voltage sources and coupled to respective deselect voltage sources. The voltages across the respective WLs and BLs are steady state at the deselect voltage.

At the start of time interval T1, WL n-gate control 321 output 312f coupled to target WL select transistor 314f transitions HIGH, thus turning WL select transistor 314f ON and coupling target WL 315f to WL select voltage source 330 and thereby WL select voltage. Target WL 315f remains coupled to WL deselect voltage source 332 during time interval T1. The non-target WLs 315a, . . . , 315e, 315g, 315h remain decoupled from the WL select voltage source 330 and coupled to the WL deselect voltage source 332. During time interval T1, the target WL voltage 402 begins to transition from deselect voltage to a voltage related to WL select voltage and deselect voltage. As a result, during time interval T1 the adjacent WL voltages 404 initially decrease towards the WL select voltage before increasing back to the deselect voltage. Capacitive effects are illustrated by the finite slope of the target WL voltage 402 as well as the change in the adjacent WL voltage 404 during interval T1. In other words, during interval T1, coupling capacitance (i.e., line to line capacitance) between the target WL and the adjacent WL "charges up" to a potential difference corresponding to a composite of the WL select voltage and deselect voltage (because of competing conduction) minus the WL deselect voltage.

Since the deselect WL transistors 324a, . . . , 324h are controlled in common by WL p-gate control module 320 via control line 322, maintaining target WL 315f coupled to WL deselect voltage source 332 allows the adjacent WLs 315a, . . . , 315e, 315g, 315h to remain coupled to WL deselect voltage source 332 and to return to the deselect voltage within time interval T1. An effect of this is that selected WL 315*f* may not reach the WL select voltage because of competing conduction between WL deselect voltage 332 source and WL select voltage source 330 via transistors 324*f* and 314*f*, respectively. WL select transistors 314*a*, ..., 314*h* and WL deselect transistors 324*a*, ..., 324*h* are configured to withstand the effects of being simultaneously coupled to a WL. A duration of time interval T1 is configured to allow the adjacent WL voltage 404 to return to the WL deselect voltage during the time interval T1.

At the start of time interval T2, WL p-gate control 320 output transitions HIGH and turns the group of deselect transistors 324*a*, ..., 324*h* OFF decoupling the WLs 315*a*, ..., 315*h* from the WL deselect voltage source 332. Thus, at the start of time interval T2, target WL 315*f* is coupled to the WL select voltage source 330 via select transistor 314*f* and decoupled from the WL deselect voltage source 332, allowing transitioning target WL voltage 402 to reach WL select voltage. The non-target members of the group, i.e., WLs 314*a*..., 314*e*, 314*g*, 314*h* are decoupled from both the WL select voltage source 330 and the WL deselect voltage source 332 and are therefore floating with respect to WL select voltage source 330 and WL deselect voltage source 330. Non-target WLs 314*a*..., 314*e*, 314*g*, 314*h* may be capacitively coupled to target WL 315*f* and may thus experience a relatively small change in voltage as illustrated by adjacent WL voltage 404 in time interval T2 due, at least in part, to this capacitive coupling. A duration of time interval T2 is configured to allow the target WL voltage 402 to reach the WL select voltage during the time interval T2.

At the start of time interval T3, BL gate control module 305 transitions the BL gate control input 311*a* to BL switch module 317*a* to LOW, thus turning transistor 319*a* ON and transistor 321*a* OFF, thereby coupling BL 117*a* to BL select voltage source 303. During time interval T3, the target WL voltage 402 remains at a steady state at the WL select voltage level and the adjacent WL(s) voltage 404 remain near the deselect voltage level. The target BL voltage 406 rises relatively rapidly to the BL select voltage level and the adjacent BL(s) voltage 408 initially rises slightly then settles near the deselect voltage level, similar to the adjacent WL voltage 404 during time interval T1. Thus, during time interval T3, the voltage across the target memory cell, e.g., memory cell 107, reaches steady state at BL select voltage minus WL select voltage.

In some embodiments, WL select enable module 323 may be configured to decouple WL select voltage source 330 from the plurality of select switches 314*a*, ..., 314*h* at the start of time interval T3. For high speed operation, a low impedance path is provided between the WL select voltage source 330 and the WLs 315*a*, ..., 315*h*. WL select enable module 323 is configured to disconnect this path at the end of time interval T2, when the target WL, e.g., WL 315*f*, has reached steady state at the WL select voltage level. Disconnecting this path is configured to facilitate relatively lower snap back energy at target memory cell 107.

Sensing and/or decode circuitry is configured to monitor the target WL 315*f* voltage in order to determine whether the target memory cell 107 stores a logic zero or a logic one. A logic one may be indicated by a snap back event and a logic zero may be indicated by an absence of a snap back event detectable on the target WL 315*f* and/or target BL 117*a*. In the example illustrated in FIGS. 3 and 4, a snap back event occurs at the end of time interval T3 as illustrated by the abrupt increase in the target WL 315*f* voltage 402. This increase in the target WL voltage corresponds to a decrease in the potential difference across memory cell 107 that results from the difference between the BL select voltage on the target BL 117*a* and the WL select voltage on the target WL 315*f*. Sense and/or decode circuitry may capture the snap back event and successfully determine that a logic one is stored in memory cell 107.

The end of time interval T3 corresponds to the beginning of time interval T4. During time interval T4, the target WL voltage 402 may decrease generally linearly after the snap back event because of conduction paths in the decoding and/or sensing circuits. The adjacent WL voltage 404 may rise relatively rapidly immediately following the snap back event before decreasing at a similar rate to the target WL voltage 402. During time intervals T3 and T4, WLs 315*a*, ..., 315*h* are decoupled from WL deselect voltage source 332 by deselect transistors 324*a*, ..., 324*h* and adjacent WLs 315*a*, ..., 315*e*, 315*g*, 315*h* are decoupled from WL select voltage source 330 by select transistors 314*a*, ..., 314*e*, 314*g*, 314*h*. Prior to snap back, coupling capacitances between the target WL 315*f* and adjacent WLs 315*a*, ..., 315*e*, 315*g*, 315*h* may store energy related to a difference between WL select voltage and WL deselect voltage. At snap back, the coupling capacitances may discharge and the adjacent WL voltage(s), e.g., adjacent WL voltage 404, may "track" the target WL voltage since the adjacent WLs 315*a*, ..., 315*e*, 315*g*, 315*h* are floating, as described herein. The capacitive coupling between the floating adjacent WLs 315*a*, ..., 315*e*, 315*g*, 315*h* and the target WL 315*f* does not violate biasing constraints of the cross-point memory array and thus may not interfere with sensing the state of the target memory cell. In the example illustrated in FIG. 4, adjacent WL voltage waveform 404 corresponds to one adjacent WL, e.g., WL 315*g*. WLs further removed from target WL 315*f*, e.g., WLs 315*a*, ..., 315*d*, 315*h*, may couple to target WL 315*f* to a lesser extent. This variation in adjacent WL voltage 404 following snap back may not interfere with accurate detection of the state of the memory cell in part because the state may be determined from the existence or absence of snap back. The sensing and decode circuitry may be configured to monitor for the presence or absence of snap back over the interval. The occurrence of the snap back provides the detection so a later increase in adjacent WL voltages may not then affect detection or affect the proper biasing of the cross-point array. The target BL voltage 406 may experience a relatively small decrease during the snap back event, may return to its steady state value of BL select voltage and remain generally constant for the remainder of interval T4.

At the start of interval T5, the WL n-gate control module 321 is configured to transition the gate input to target select transistor 314*f* from HIGH to LOW, thereby turning the target select transistor 314*f* OFF and decoupling the target WL 315*f* from the WL select voltage source 330. Also, the WL p-gate control module 320 is configured to transition the gate control input to the group of deselect transistors 324*a*, ..., 324*h* from HIGH to LOW and couple the WLs 315*a*, ..., 315*h* to the WL deselect voltage source 332. The BL gate control module 305 is configured to transition the gate input to BL switch module 317*a* from LOW to HIGH thereby coupling BL 117*a* to the BL deselect voltage source 307. Thus, the BLs 117 and WLs 315*a*, ..., 315*h* may be returned to their initial state prior to interval T1 to be ready for their next memory operation.

Floating non-target WLs, i.e. a plurality of WLs adjacent each side of a target WL is configured to reduce the effective capacitance associated with the target WL. Floating the adjacent WLs as part of a memory cell access operation and prior to the snap back event may reduce the magnitude of the capacitive displacement current that may flow through the target memory cell compared to a case where adjacent WLs are not floated. The reduction in effective capacitance is configured to enable the sensing circuits to remain electrically connected to the target WL thereby facilitating reliable detection of a state of target memory cell while also minimizing possible disturb energy.

Figure 5:
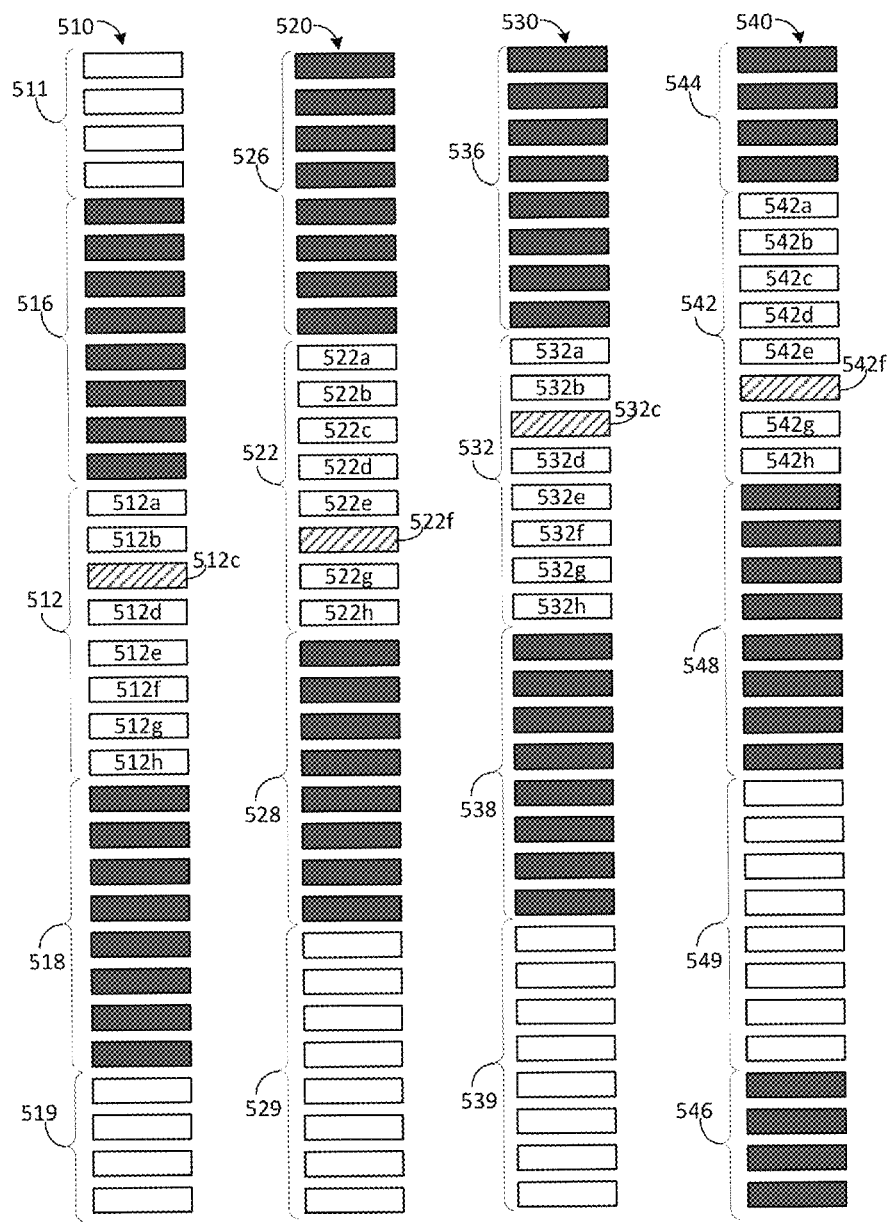
FIG. 5 illustrates examples of a local neighborhood of WLs for a series of four sequential memory access requests consistent with various embodiments of the present disclosure.

FIG. 5 illustrates examples 510, 520, 530, 540 of a local neighborhood of WLs for a series of four sequential memory access requests consistent with various embodiments of the present disclosure. For tile sizes of interest, the local neighborhood may be 256 WL's. This number is based on a trade-off between decoding complexity and energy dissipation. WL's outside the local neighborhood may be considered deselected throughout the access cycle. The example shows four sequential address locations although the sequence of access can be in any order. Memory controller module 110 of FIG. 1 may be configured to receive the memory access requests, including respective memory address identifiers, from processor 102, as described herein. The memory controller module 110 may then determine a target WL address based, at least in part, on the received memory address identifier. Each example 510, 520, 530, 540 of the local neighborhood corresponds to a respective memory access request and illustrates a state of each WL in the local neighborhood in response to the memory access request. The states of the WLs illustrated in FIG. 5 correspond to time intervals T2, T3 and T4 of FIG. 4, for a respective target WL.

Each rectangle in the examples 510, 520, 530, 540 of the local neighborhood represents a WL. Each rectangle in a row of rectangles corresponds to a same WL and the fill type corresponds to a state of the WL for a respective memory access request. Rectangles with white fill represent floated WLs, i.e., WLs decoupled from WL select voltage source and WL deselect voltage source. Rectangles with dark fill represent deselected WLs, i.e., WLs decoupled from WL select voltage source and coupled to WL deselect voltage source. Rectangles with cross-hatching represent target WLs, i.e., WLs coupled to WL select voltage source and decoupled from the deselect voltage source during time intervals T2, T3 and T4 of FIG. 4.

It should be noted that a cross-point memory array may include many more WLs than are illustrated in the examples 510, 520, 530, 540 of the local neighborhood. Such memory arrays may include one or more global neighborhoods of WLs that include pluralities of WLs outside the local neighborhood illustrated in examples 510, 520, 530, 540. Generally, WLs may be deselected by default (as illustrated by the time period preceding time interval T1 in FIG. 4. As used herein, "deselected" means coupled to a WL deselect voltage source. In some embodiments, in response to a memory access request, alternating subgroups of WLs in a local neighborhood that includes a target WL may be floated (i.e., decoupled from the WL deselect voltage source).

The WLs in each example 510, 520, 530, 540 of the local neighborhood are arranged in subgroups with each subgroup including eight WLs. Subgroups including more or fewer WLs may be implemented and are within the scope of the present disclosure. The local neighborhood and alternating arrangement of subgroups of predefined size are configured to reduce circuit complexity and to reduce decoding energy, e.g., may facilitate selection of a subgroup by decoding fewer than all of the bits in a WL address.

The first example 510 of the local neighborhood includes a portion 511 of a first subgroup of floated WLs, a first subgroup 516 of deselected word lines 516, a subgroup 512 that includes a target WL 512c and a plurality of floated WLs 512a, 512b, 512d, ..., 512h, a second subgroup of deselected WLs 518 and a portion 519 of a second subgroup of floated WLs. Subgroup 512 is bounded by subgroup 516 and subgroup 518. Subgroup 512 thus includes target WL 512c and adjacent WLs 512a, 512b, 512d, ..., 512h. Target WL 512c is separated from a subgroup boundary by at least two adjacent WLs 512a and 512b and 512d, ..., 512h. A memory access, as described herein, may thus be performed on a memory cell associated with target WL 512c while reducing the effective capacitance associated with target WL 512c by floating adjacent WLs 512a, 512b, 512d, ..., 512h of subgroup 512.

The second example 520 of the local neighborhood includes a first subgroup of deselected word lines 526, a subgroup 522 that includes a target WL 522f and a plurality of floated WLs 522a, ..., 522e, 522g, 522h, a second subgroup of deselected WLs 528 and a second subgroup 529 of floated WLs. Subgroup 522 is bounded by subgroup 526 and subgroup 528. Subgroup 522 thus includes target WL 522f and adjacent WLs 522a, ..., 522e, 522g, 522h. In this example, it is assumed that a second memory access request follows the first memory access associated with target WL 512c of subgroup 512. The second memory access request includes a memory cell identifier that corresponds to target WL 522f. Target WL 522f of example 520 corresponds to WL 512b of example 510. Memory controller module 110 may be configured to determine whether sufficient adjacent WLs separate target WL 522f from a boundary of subgroup 512. Since WL 522f is separated from a boundary of subgroup 512 by one adjacent WL, i.e., WL 512a, with a minimum margin of two adjacent WLs, insufficient adjacent WLs separate target WL 522f from the boundary. Thus, the subgroup that includes target WL 522f may be shifted prior to performing the requested target memory cell access operation(s). The subgroup that includes target WL 522f may be shifted by four WLs, i.e., from the location of subgroup 512 in example 510 to the location of subgroup 522 in example 520. A memory access, as described herein, may thus be performed on a memory cell associated with target WL 522f while reducing the effective capacitance of WL 522f by floating adjacent WLs 522a, ..., 522e, 522g, 522h of subgroup 522.

The third example 530 of the local neighborhood includes a first subgroup 536 of deselected WLs, a subgroup 532 that includes a target WL 532c and a plurality of floated WLs 532a, 532b, 532d, ..., 532h, a second subgroup of deselected WLs 538 and a second subgroup 539 of floated WLs. Subgroup 532 is bounded by subgroup 536 and subgroup 538. In this example 530, it is assumed that a third memory access request follows the second memory access associated with target WL 522f of subgroup 522. The third memory access request includes a memory cell identifier that corresponds to target WL 532c. Target WL 532c of example 530 corresponds to WL 522c of example 520. Memory controller module 110 may be configured to determine whether sufficient adjacent WLs separate target WL 532c from a boundary of subgroup 532. Since WL 532c is separated from a first boundary of subgroup 532 by two adjacent WLs 532a, 532b and from a second boundary of subgroup 532 by more than two adjacent WLs, with a minimum margin of two adjacent WLs, sufficient adjacent WLs separate target WL 532c from the boundary. Thus, the subgroup that includes target WL 532c may not be shifted, prior to performing the requested target memory cell access operation. A memory access, as described herein, may thus be performed on a memory cell associated with target WL 532c while reducing the effective capacitance associated with WL 532c by floating adjacent WLs 532a, 532b, 532d, ..., 532h of subgroup 532.

The fourth example 540 of the local neighborhood includes a portion 544 of a first subgroup of deselected WLs, a subgroup 542 that includes a target WL 542f and a plurality of floated WLs 542a, ..., 542e, 542g, 542h, a second subgroup of deselected WLs 548, a second subgroup 549 of floated WLs and a portion 546 of a third subgroup of deselected WLs. Subgroup 542 is bounded by subgroup 546 and subgroup 548. In this example, it is assumed that a fourth memory access request follows the third memory access associated with target WL 532c of subgroup 532. Similar to example 520, memory controller module 110 may be configured to determine whether sufficient adjacent WLs separate target WL 542f from a boundary of subgroup 532. Since insufficient adjacent WLs separate target WL 542f from a boundary of subgroup 532, the subgroup that includes target WL 542f may be shifted by, e.g., four WLs, prior to performing the requested target memory cell access. A memory access, as described herein, may thus be performed on a memory cell associated with target WL 542f while reducing the effective capacitance associated with WL 542f by floating adjacent WLs 542a, ..., 542e, 542g, 542h of subgroup 542.

Thus, a local neighborhood of WLs may be predefined and/or may be defined in response to a memory access request. WLs may typically be deselected in a global neighborhood and alternating subgroups may be floated in a local neighborhood, e.g., in response to a memory access request. A size of a subgroup may be predefined and may be configured to reduce circuit complexity and/or to reduce energy consumption associated with a memory access event. The discrete sliding windows associated with subgroup boundaries are likewise configured to minimize energy consumption and circuit complexity. A minimum number of adjacent WLs between a target WL and a subgroup boundary for a subgroup that includes the target WL is configured to reduce disturb energy associated with a snap back event, as described herein.

Figure 6:
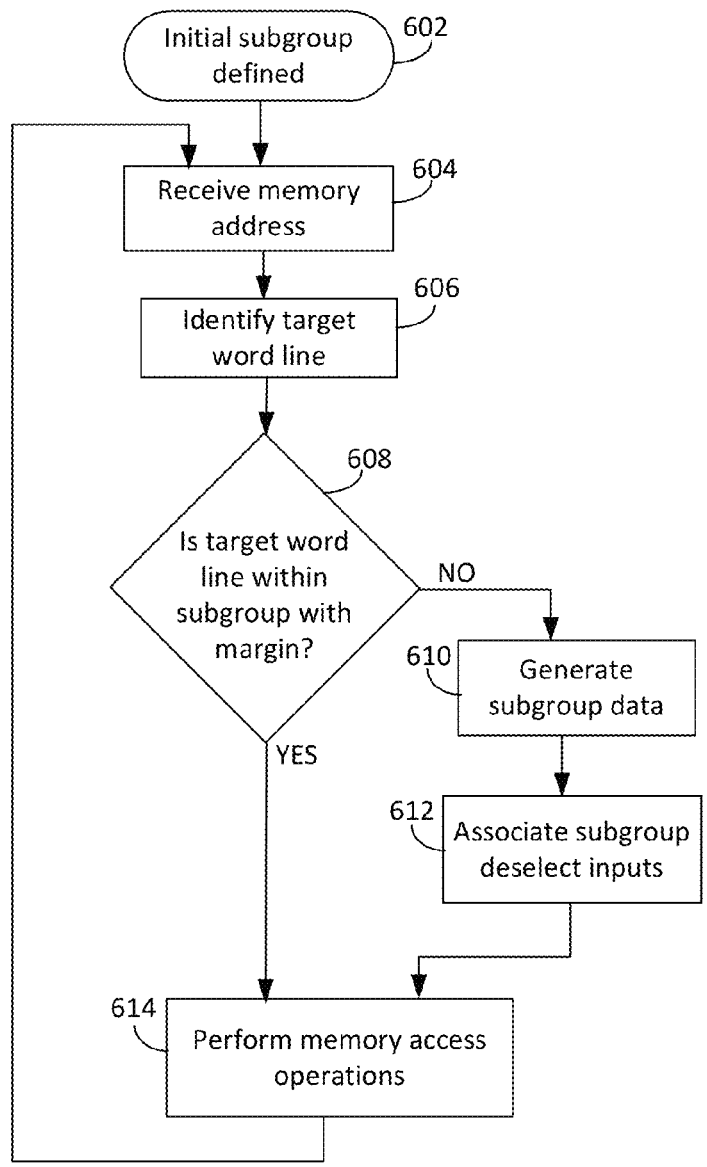
FIG. 6 illustrates a flowchart of operations including defining a subgroup consistent with various embodiments of the present disclosure.

FIG. 6 illustrates a flowchart 600 of operations including defining a subgroup consistent with various embodiments of the present disclosure. The operations may be performed by a memory controller consistent with the present disclosure. In particular, flowchart 600 depicts exemplary operations configured to identify a target WL address based on a received memory address and to determine a subgroup of WL addresses based, at least in part, on the identified target WL address. The subgroup is configured to ensure that the target WL address is no closer than a number of WL addresses (i.e., a margin) from a boundary of the subgroup. The margin corresponds to a minimum number of adjacent WLs on each side of a target WL to be floated during a memory access operation, as described herein.

The operations of flowchart 600 may begin at operation 602. An initial subgroup may be defined at operation 602. For example, an initial subgroup may be defined as part of an initialization process. In another example, an initial subgroup may have been defined as part of a prior memory access operation. Operation 604 includes receiving a memory address. For example, the memory address may be received from a processor, e.g., processor 102. The memory address may be received by a memory controller consistent, e.g., memory controller 104, with the present disclosure. A target WL may be identified at operation 606. The target WL identifier (e.g., address) may be based on and/or associated with the received memory address. For example, memory controller module 110 and/or subgroup windowing module 112 may be configured to identify the target WL address.

Whether the target WL is within the subgroup with a margin may be determined at operation 614. For example, the subgroup may be defined by a minimum WL address and a subgroup size, the minimum WL address and a maximum WL address or the subgroup size and the maximum WL address. The margin may correspond to a minimum number of adjacent WLs on each side of the target WL to be floated, as described herein. For example, the margin may be greater than or equal to two. If the target WL address is between the minimum WL address plus the margin and the maximum WL address minus the margin, the target WL address may be understood to be within the subgroup with margin and program flow may proceed to operation 614.

If the target WL address is not between the minimum WL address plus the margin and the maximum WL address minus the margin, program flow may proceed to operation 610 and new subgroup data may be generated. Subgroup data may include a minimum WL address, maximum WL address and/or size of the subgroup. Subgroup data may be generated based, at least in part, on the identified target WL address. In some embodiments, the subgroup data may be generated based, at least in part, on the desired margin. For example, a subgroup may be defined that includes the target WL address at or near the subgroup minimum WL address plus the margin or at or near the subgroup maximum WL address minus the margin. In another example, the subgroup may be defined with the target WL address at or near a center of the subgroup. In another example, the new subgroup may be defined by sliding a window a predefined number of addresses with the predefined number related to the subgroup size. For example, for a subgroup size of eight, the predefined number may be four. In any case, once the subgroup has been defined, subgroup data may be generated.

Operation 612 includes associating subgroup deselect inputs. For example, gate inputs to deselect switches coupled to WLs with WL addresses corresponding to the subgroup data may be logically coupled. Thus, a deselect WL gate controller may couple or decouple the subgroup of WLs to or from the deselect voltage source with one control output. Memory access operations may be performed at operation 614.

Thus, a target WL address may be identified based on a received memory address. A range of WL addresses (i.e., a subgroup) may be determined based, at least in part, on the identified target WL address. The size of the range may correspond to a subgroup size, as described herein. The range may be determined with margins between the maximum and/or minimum WL address and the identified target WL address. The margins are configured to facilitate reducing the effective capacitance associated with a target WL, as described herein.

Figure 7:
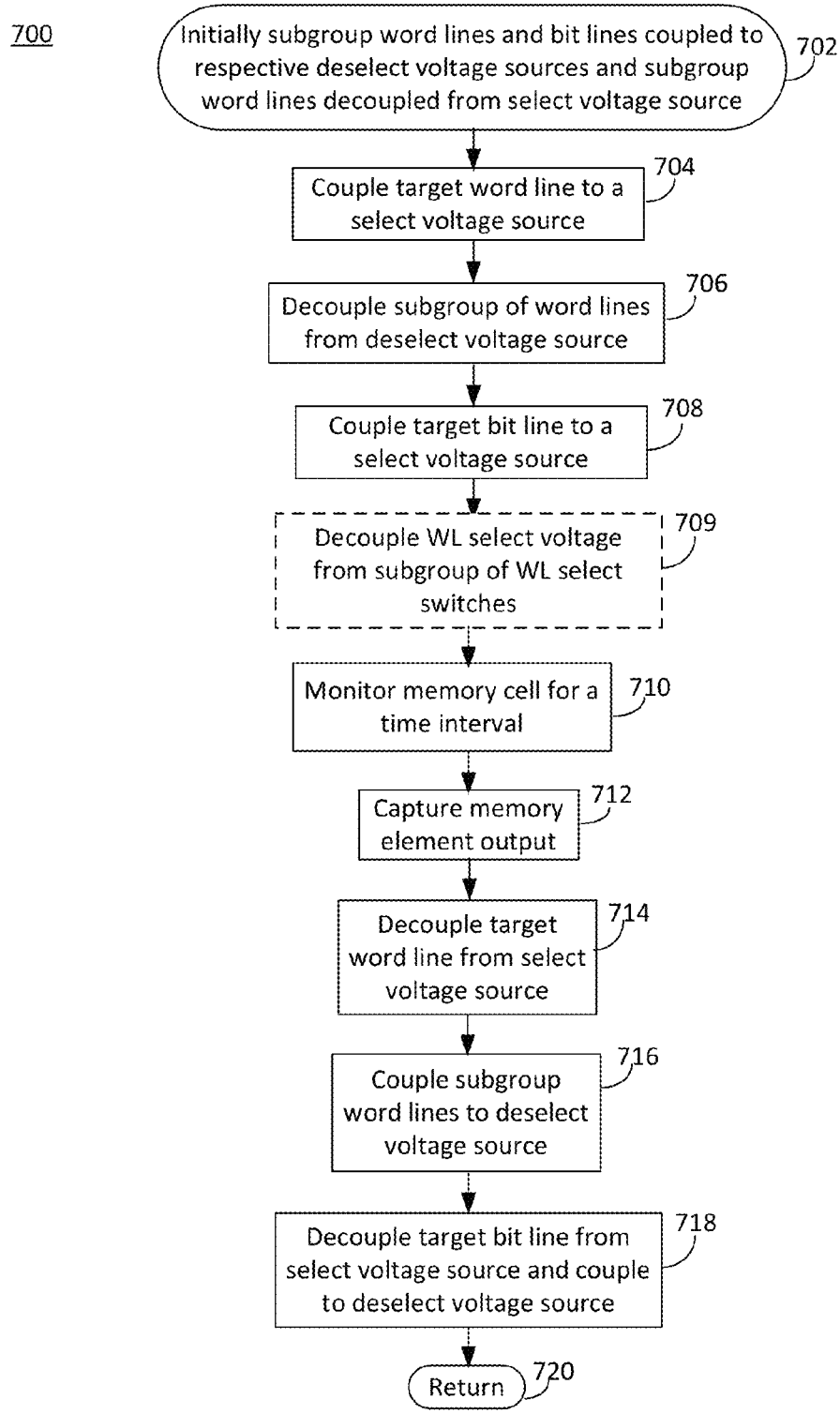
FIG. 7 illustrates a flowchart of operations for a performing a memory access consistent with various embodiments of the present disclosure.

FIG. 7 illustrates a flowchart 700 of operations for a performing a memory access consistent with various embodiments of the present disclosure. The operations of flowchart 700 correspond to operation 614 of flowchart 600. The operations may be performed, for example, by a memory controller, e.g., memory controller 104, including WL control module 114 and BL control module 116. Flowchart 700 depicts exemplary operations configured to reduce effective capacitance associated with a target WL during a memory access operation, e.g., a read operation. In particular, flowchart 700 depicts exemplary operations configured to couple and/or decouple WLs associated with the subgroup of flowchart 600 to the select and/or deselect voltage sources, as described herein.

Operations of flowchart 700 may begin with an initial state as described in operation 702. Initially, a subgroup of WLs and BLs may be coupled to respective deselect voltage sources and the subgroup of WLs may be decoupled from the WL select voltage source. A target WL may be coupled to the WL select voltage source at operation 704. The subgroup of WLs may be decoupled from the WL deselect voltage source at operation 706. Thus, WLs adjacent the target WL are decoupled from both the WL select voltage source and the WL deselect voltage source and are floating after operation 706. Operation 708 includes coupling a target BL to the BL select voltage source. Since the target WL is coupled to the WL select voltage source, coupling the target BL to the BL select voltage source is configured to apply a differential voltage (the difference between the BL select voltage source and the WL select voltage source) across the target memory cell. Each of operations 704, 706 and 708 may be preceded and/or followed by a time interval (e.g., a time delay). For example, the time intervals may be configured to allow transients to settle out.

In some embodiments, operation 709 may be included in flowchart 700. Operation 709 includes decoupling the WL select voltage source from the subgroup of WL select switches. It should be noted that operations 708 and 709 may be performed in parallel.

Operation 710 may include monitoring the target memory cell for a time interval. A memory element output may be captured at operation 712. Operation 714 may include decoupling the target WL from the WL select supply voltage. Operation 716 may include coupling the range of WLs (i.e., subgroup) to the WL deselect supply voltage. Operation 718 may include decoupling the target BL from the BL select voltage source and coupling the target BL to the BL deselect voltage source. Program flow may return at operation 720. It should be noted that operations 714, 716 and/or 718 may be performed in parallel.

Thus, the operations of flowchart 700 are configured to manage coupling and decoupling the target WL to and from the select voltage source and subgroup of WLs to and from the deselect voltage source. Such operations are configured to float the WLs adjacent the target WL to reduce effective capacitance associated with the target WL in order to reduce disturb energy due to snap back to facilitate an accurate memory cell access operation.

While FIGS. 6 and 7 illustrate various operations according one embodiment, it is to be understood that not all of the operations depicted in FIGS. 6 and 7 are necessary for other embodiments. Indeed, it is fully contemplated herein that in other embodiments of the present disclosure, the operations depicted in 6 and 7 and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "module" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The modules may, collectively or individually, be embodied as circuitry that forms part of a larger system, for example, an integrated circuit (IC), system on-chip (SoC), desktop computers, laptop computers, tablet computers, servers, smart phones, etc.

Thus, a system and method configured to reduce effective capacitance associated with a target address line in a cross-point memory during memory access operations has been described. The system and method are configured to decouple a plurality of address lines adjacent each side of a target address line from all bias voltage sources, i.e., to "float" the pluralities of address lines. The system and method are configured to define a local neighborhood of address lines within a memory array, and within this local neighborhood, to define a subgroup of address lines (WLs or BLs) that includes the target address line and a plurality of adjacent address lines. When an address line in the subgroup is identified for a memory access operation (e.g., a read or write operation), the system and method are configured to determine whether the identified address line is located too close to the boundaries of the subgroup. If the identified address line is too close to the boundaries, a new subgroup may be defined that includes the identified address line and pluralities of adjacent address lines between the identified address line and the boundaries of the group.

The system and method are configured to reduce the effective capacitance (e.g., line to line capacitance and/or electrode capacitance) associated with the target WL while minimizing circuit complexity and energy consumption, as described herein. Reducing the effective capacitance is configured to reduce disturb energy during snap back, thereby increasing operational life of a cross-point memory system.

According to one aspect there is provided an apparatus. The apparatus includes a memory controller module configured to identify a target word line in response to a memory access request, the target word line included in a cross-point memory, the memory controller module further configured to perform a memory access operation on a memory cell of the cross-point memory, the memory cell coupled between the target word line and a bit line; and a word line control module configured to float at least one adjacent word line adjacent the target word line, the floating comprising decoupling the at least one adjacent word line from a at least one of a first voltage source or a second voltage source.

Another example apparatus includes the forgoing components and further includes a subgroup windowing module configured to determine a subgroup of word lines based, at least in part on a target word line identifier, the subgroup comprising the target word line and the plurality of adjacent word lines.

Another example apparatus includes the forgoing components and the word line control module is configured to associate a plurality of switches configured to decouple the subgroup of word lines from the first voltage source, the associating configured to facilitate simultaneous decoupling of the subgroup of word lines from the first voltage source.

Another example apparatus includes the forgoing components and that at least two adjacent word lines separate the target word line from a subgroup boundary.

Another example apparatus includes the forgoing components and the word line control module is configured to couple the target word line to the second voltage source and couple the bit line to a third voltage source, a difference between a second supply voltage and a third supply voltage configured to facilitate the memory access operation.

Another example apparatus includes the forgoing components and the memory controller module is configured to monitor the memory cell for a time interval and capture an output from the memory cell, the memory access operation comprising a read operation According to another aspect there is provided a method. The method includes identifying a target word line in response to a memory access request, the target word line included in a cross-point memory; floating at least one adjacent word line adjacent the target word line, the floating comprising decoupling the at least one adjacent word line from a at least one of a first voltage source or a second voltage source; and performing a memory access operation on a memory cell of the cross-point memory, the memory cell coupled between the target word line and a bit line.

Another example method includes the foregoing operations and further includes determining whether the target word line is included in a subgroup of word lines.

Another example method includes the foregoing operations and further includes determining a subgroup of word lines based, at least in part on a target word line identifier, the subgroup comprising the target word line and the plurality of adjacent word lines.

Another example method includes the foregoing operations and further includes associating a plurality of switches configured to decouple the subgroup of word lines from the first voltage source, the associating configured to facilitate simultaneous decoupling of the subgroup of word lines from the first voltage source.

Another example method includes the foregoing operations and at least two adjacent word lines separate the target word line from a subgroup boundary.

Another example method includes the foregoing operations and further includes coupling the target word line to the second voltage source; and coupling the bit line to a third voltage source, a difference between a second supply voltage and a third supply voltage configured to facilitate the memory access operation.

Another example method includes the foregoing operations and further includes monitoring the memory cell for a time interval; and capturing an output from the memory cell, the memory access operation comprising a read operation.

According to another aspect there is provided a system. The system includes a processor; a cross-point memory array comprising a memory cell, a target word line and a bit line, the memory cell coupled between the target word line and the bit line; and a memory controller coupled to the processor and the cross-point memory array. The memory controller includes a memory controller module configured to identify the target word line in response to a memory access request from the processor and to perform a memory access operation on the memory cell, and a word line control module configured to float at least one adjacent word line adjacent the target word line, the floating comprising decoupling the at least one adjacent word line from a at least one of a first voltage source or a second voltage source.

Another example system includes the forgoing components and the memory controller further comprises a subgroup windowing module configured to determine a subgroup of word lines based, at least in part on a target word line identifier, the subgroup comprising the target word line and the plurality of adjacent word lines.

Another example system includes the forgoing components and the word line control module is configured to associate a plurality of switches configured to decouple the subgroup of word lines from the first voltage source, the associating configured to facilitate simultaneous decoupling of the subgroup of word lines from the first voltage source.

Another example system includes the forgoing components and at least two adjacent word lines separate the target word line from a subgroup boundary.

Another example system includes the forgoing components and that a size of the subgroup is eight.

Another example system includes the forgoing components and the word line control module is configured to couple the target word line to the second voltage source and couple the bit line to a third voltage source, a difference between a second supply voltage and a third supply voltage configured to facilitate the memory access operation.

Another example system includes the forgoing components and the memory controller module is configured to monitor the memory cell for a time interval and capture an output from the memory cell, the memory access operation comprising a read operation.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
a memory controller module configured to identify a target word line in response to a memory access request, the target word line included in a first subgroup of word lines of a cross-point memory, the memory controller module further configured to perform a memory access operation on a memory cell of the cross-point memory, the memory cell coupled between the target word line and a bit line;
a word line control module configured to float at least one adjacent word line adjacent the target word line, the floating comprising decoupling the at least one adjacent word line from at least one of a first voltage source or a second voltage source; and
a subgroup windowing module configured to:
determine whether the target word line is closer to a boundary of said first subgroup than a pre-determined margin;
define a second subgroup that is different from said first subgroup when said target word line is closer to said boundary than said pre-determined margin; and
maintain the first subgroup when said target word line is further from said boundary than said pre-determined margin.

2. The apparatus of claim 1, wherein said subgroup windowing module is to define said second subgroup at least in part by shifting said first subgroup by a number of wordlines that corresponds to a pre-determined fraction of a size of said existing subgroup.

3. The apparatus of claim 2, wherein said floating comprises simultaneously decoupling at least two adjacent word lines adjacent to the target word line from said first voltage source.

4. The apparatus of claim 2, wherein at least two adjacent word lines separate the target word line from the boundary of said first subgroup or a boundary of said second subgroup.

5. The apparatus of claim 1, wherein the word line control module is configured to couple the target word line to the second voltage source and couple the bit line to a third voltage source, a difference between a second supply voltage and a third supply voltage configured to facilitate the memory access operation.

6. The apparatus of claim 5, wherein the memory controller module is configured to monitor the memory cell for a time interval and capture an output from the memory cell, the memory access operation comprising a read operation.

7. A method comprising:
identifying a target word line in response to a memory access request, the target word line included in a first subgroup of wordlines of a cross-point memory;
determining whether the target word line is closer to a boundary of said first subgroup than a predetermined margin;
defining a second subgroup of word lines that is different from said first sub-group when said target word line is closer to said boundary than said predetermined margin;
maintaining the first subgroup when said target word line is further from said boundary than said predetermined margin;
floating at least one adjacent word line adjacent the target word line, the floating comprising decoupling the at least one adjacent word line from at least one of a first voltage source or a second voltage source; and
performing a memory access operation on a memory cell of the cross-point memory, the memory cell coupled between the target word line and a bit line.

8. The method of claim 7, wherein defining the second subgroup comprises shifting the first subgroup by a discrete interval.

9. The method of claim 8, wherein said discrete interval corresponds to a predetermined fraction of a size of said first subgroup.

10. The method of claim 9, wherein said floating comprises simultaneously decoupling at least two adjacent word lines adjacent the target word line from the first voltage source.

11. The method of claim 7, wherein at least two adjacent word lines separate the target word line from the boundary of said first subgroup or a boundary of said second subgroup.

12. The method of claim 7, further comprising:
coupling the target word line to the second voltage source; and
coupling the bit line to a third voltage source, a difference between a second supply voltage and a third supply voltage configured to facilitate the memory access operation.

13. The method of claim 12, further comprising:
monitoring the memory cell for a time interval; and
capturing an output from the memory cell, the memory access operation comprising a read operation.

14. A system comprising:
a processor;
a cross-point memory array comprising a memory cell coupled between a target word line and a bit line; and
a memory controller coupled to the processor and the cross-point memory array, the memory controller comprising a memory controller module configured to identify the target word line in a first subgroup of wordlines in response to a memory access request from the processor and to perform a memory access operation on the memory cell;
a word line control module configured to float at least one adjacent word line adjacent the target word line, the floating comprising decoupling the at least one adjacent word line from at least one of a first voltage source or a second voltage source; and
a subgroup windowing module configured to:
determine whether the target word line is closer to a boundary of said first subgroup than a pre-determined margin;
define a second subgroup that is different from said first subgroup when said target word line is closer to said boundary than said pre-determined margin;
maintain the first subgroup when said target word line is further from said boundary than said pre-determined margin.

15. The system of claim 14, wherein said subgroup windowing module is to define said second subgroup at least in part by shifting said first subgroup by a number of wordlines that corresponds to a pre-determined fraction of a size of said existing subgroup.

16. The system of claim 15, wherein said floating comprises simultaneously decoupling at least two adjacent word lines adjacent to the target word line from said first voltage source.

17. The system of claim 15, wherein at least two adjacent word lines separate the target word line from the boundary of said first subgroup or a boundary of said second subgroup.

18. The system of claim 15, wherein a size of the subgroup is eight.

19. The system of claim 14, wherein the word line control module is configured to couple the target word line to the second voltage source and couple the bit line to a third voltage source, a difference between a second supply voltage and a third supply voltage configured to facilitate the memory access operation.

20. The system of claim 19, wherein the memory controller module is configured to monitor the memory cell for a time interval and capture an output from the memory cell, the memory access operation comprising a read operation.

* * * * *